(12) United States Patent
Lin et al.

(10) Patent No.: US 9,312,245 B2
(45) Date of Patent: Apr. 12, 2016

(54) III-NITRIDE DEVICE AND FET IN A PACKAGE

(71) Applicant: International Rectifier Corporation, El Segundo, CA (US)

(72) Inventors: Heny Lin, Irvine, CA (US); Jason Zhang, Monterey Park, CA (US); Alberto Guerra, Palos Verdes Estates, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/496,140

(22) Filed: Sep. 25, 2014

(65) Prior Publication Data

US 2015/0008445 A1    Jan. 8, 2015

Related U.S. Application Data

(63) Continuation of application No. 13/053,556, filed on Mar. 22, 2011, now Pat. No. 8,847,408.

(60) Provisional application No. 61/448,347, filed on Mar. 2, 2011.

(51) Int. Cl.
*H01L 25/07* (2006.01)
*H01L 27/20* (2006.01)
(Continued)

(52) U.S. Cl.
CPC ........ *H01L 25/074* (2013.01); *H01L 23/49562* (2013.01); *H01L 23/49575* (2013.01); *H01L 24/48* (2013.01); *H01L 24/69* (2013.01); *H01L 24/72* (2013.01); *H01L 29/16* (2013.01); *H01L 29/2003* (2013.01); *H01L 29/772* (2013.01); *H01L 24/29* (2013.01); *H01L 24/32* (2013.01); *H01L 24/45* (2013.01); *H01L 24/49* (2013.01); *H01L 24/73* (2013.01); *H01L 29/778* (2013.01); *H01L 2224/2919* (2013.01); *H01L 2224/32145* (2013.01); *H01L 2224/32245* (2013.01); *H01L 2224/45014* (2013.01); *H01L 2224/45124* (2013.01); *H01L 2224/45144* (2013.01); *H01L 2224/45147* (2013.01); *H01L 2224/48145* (2013.01); *H01L 2224/48247* (2013.01); *H01L 2224/49111* (2013.01); *H01L 2224/73265* (2013.01); *H01L 2225/0651* (2013.01);
(Continued)

(58) Field of Classification Search
CPC ... H01L 25/074; H01L 29/772; H01L 23/495; H01L 23/49537; H01L 23/49575; H01L 29/2003; H01L 29/778
See application file for complete search history.

(56) References Cited

U.S. PATENT DOCUMENTS 5,289,344 A * 2/1994 Gagnon et al. ............ 361/712
2006/0290407 A1* 12/2006 Salato et al. ............... 327/427
(Continued)

*Primary Examiner* — Michele Fan
(74) *Attorney, Agent, or Firm* — Farjami & Farjami LLP

(57) ABSTRACT

One exemplary disclosed embodiment comprises a three-terminal stacked-die package including a field effect transistor (PET), such as a silicon PET, stacked atop a III-nitride transistor, such that a drain of the PET resides on and is electrically coupled to a source of the III-nitride transistor. A first terminal of the package is coupled to a gate of the FET, a second terminal of the package is coupled to a drain of the III-nitride transistor. A third terminal of the package is coupled to a source of the FET. In this manner, devices such as cascoded switches may be packaged in a stacked-die form, resulting in reduced parasitic inductance and resistance, improved thermal dissipation, smaller form factor, and lower manufacturing cost compared to conventional packages.

8 Claims, 3 Drawing Sheets

(51) Int. Cl.
  *H01L 23/495* (2006.01)
  *H01L 29/20* (2006.01)
  *H01L 29/16* (2006.01)
  *H01L 29/772* (2006.01)
  *H01L 23/00* (2006.01)
  *H01L 29/778* (2006.01)
(52) U.S. Cl.
  CPC ............ *H01L2225/06506* (2013.01); *H01L 2225/06568* (2013.01); *H01L 2924/01013* (2013.01); *H01L 2924/01014* (2013.01); *H01L 2924/1033* (2013.01); *H01L 2924/10253* (2013.01); *H01L 2924/10323* (2013.01); *H01L 2924/10334* (2013.01); *H01L 2924/10344* (2013.01); *H01L 2924/10346* (2013.01); *H01L 2924/1306* (2013.01); *H01L 2924/15787* (2013.01); *H01L 2924/30107* (2013.01)

(56) References Cited

U.S. PATENT DOCUMENTS

| 2009/0108467 | A1* | 4/2009 | Otremba ..................... 257/777 |
| 2010/0090668 | A1* | 4/2010 | Girdhar et al. ............... 323/282 |
| 2011/0024917 | A1* | 2/2011 | Bhalla et al. ................. 257/777 |
| 2011/0169549 | A1* | 7/2011 | Wu ............................... 327/434 |
| 2011/0193619 | A1* | 8/2011 | Parikh et al. ................. 327/534 |

* cited by examiner

ID-NITRIDE DEVICE AND FET IN A PACKAGE

BACKGROUND OF THE INVENTION

This is a continuation of application Ser. No. 13/053,556 filed Mar. 22, 2011.

The present application claims the benefit of and priority to a provisional application entitled "III-Nitride Transistor Stacked with FET in a Package," Ser. No. 61/448,347 filed on Mar. 2, 2011. The disclosure in that pending provisional application is hereby incorporated fully by reference into the present application.

DEFINITION

In the present application, "III-nitride" refers to a compound semiconductor that includes nitrogen and at least one group III element, such as, but not limited to, GaN, AlGaN, InN, MN, InGaN, InAlGaN and the like.

1. Field of the Invention

The present invention relates generally to semiconductor devices. More particularly, the present invention relates to packaging of semiconductor devices.

2. Background Art

For high power and high performance circuit applications, III-nitride transistors such as gallium nitride (GaN) field effect transistors (FETs) are often desirable for their high efficiency and high voltage operation. In particular, it is often desirable to combine such III-nitride transistors with other FETs, such as silicon FETs, to create high performance switching devices such as cascoded switches.

Unfortunately, conventional packaging integration techniques for combining III-nitride transistors with silicon FETs often negate the benefits provided by such III-nitride transistors. For example, conventional package designs may place discrete components side-by-side on a common support surface, for example a ceramic base substrate such as direct bonded copper (DBC) or a ceramic substrate on a lead-frame. The routing of current through the substrate or lead-frame undesirably increases the parasitic inductance, resistance, and thermal dissipation requirements of the package. Moreover, the side-by-side placement of package devices on the substrate undesirably increases package form factor and manufacturing cost.

Thus, a unique and cost-effective solution is needed to support the efficient design and operation of packages integrating III-nitride transistors with other FETs, such as silicon FETs.

SUMMARY OF THE INVENTION

A III-nitride transistor stacked with FET in a package, substantially as shown in and/or described in connection with at least one of the figures, and as set forth more completely in the claims.

DETAILED DESCRIPTION OF THE INVENTION

The present application is directed to a III-nitride transistor stacked with FET in a package. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings.

Figure 1:
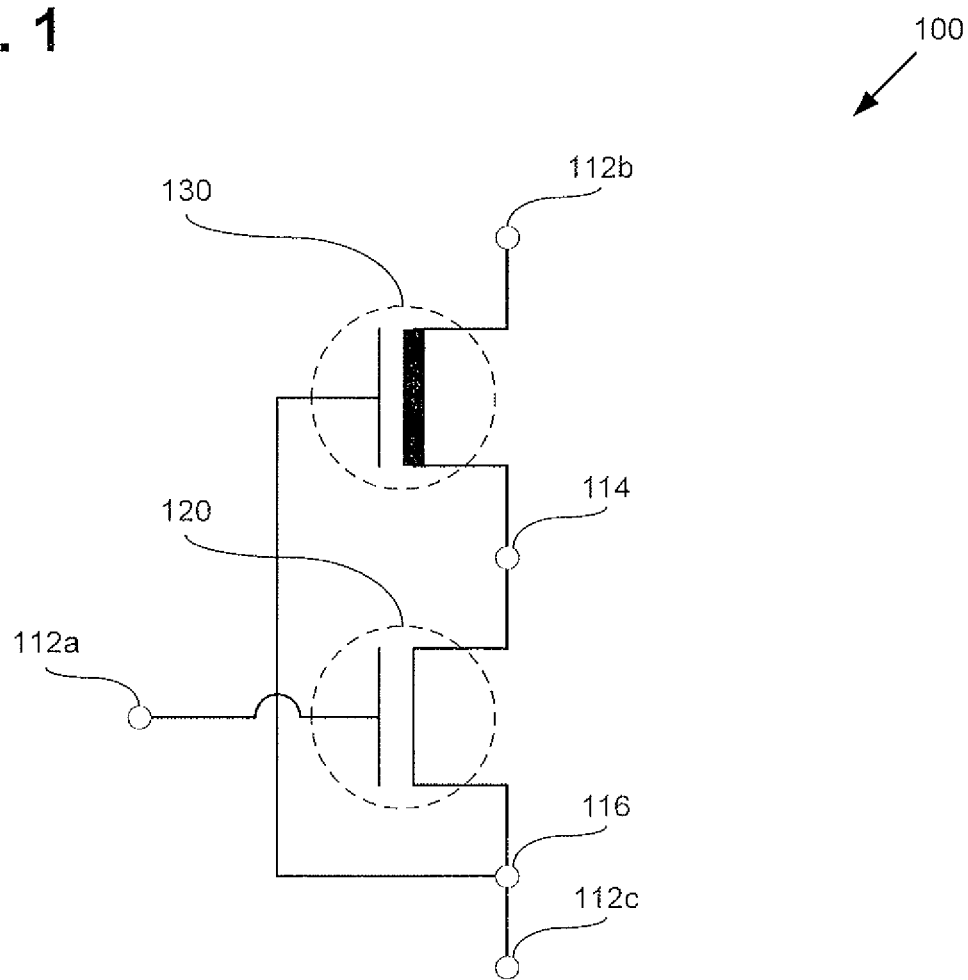
FIG. 1 illustrates a circuit diagram of a III-nitride transistor coupled with a FET, such as a silicon FET.

FIG. 1 illustrates a circuit diagram of a III-nitride transistor coupled with a PET, such as a silicon FET. In the present application, references to a "silicon FET" are made for brevity and convenience only. However, the "silicon FET" in the context of the present invention's stacked-die package can be replaced with a non-silicon FET or in general with any FET (field effect transistor). Diagram 100 includes terminals 112a, 112b, and 112c, nodes 114 and 116, silicon FET 120, and III-nitride transistor 130. III-nitride transistor 130 may, for example, comprise a gallium nitride (GaN) FET or a GaN high mobility electron transistor (HEMT), and may more specifically comprise a depletion-mode GaN transistor. Additionally, while silicon FET 120 is specified as a silicon device in diagram 100, alternative embodiments may use other semiconductor materials.

In the example shown in diagram 100 of FIG. 1, the drain of silicon FET 120 is coupled to the source of III-nitride transistor 130 at node 114. Additionally, a cascoded switch configuration is formed by coupling the gate of III-nitride transistor 130 to the source of silicon FET 120 at node 116. Thus, the circuit of diagram 100 implements a high performance cascoded switch. However, in alternative embodiments, the circuit in diagram 100 may comprise a different configuration of silicon FET 120 with III-nitride transistor 130.

As discussed above, it may be desirable to implement the circuit of diagram 100 in an integrated package. However, conventional approaches such as co-packing silicon FET 120 with III-nitride transistor 130 on a ceramic base substrate or a ceramic substrate on a lead-frame disadvantageously increases the parasitic inductance, resistance, thermal dissipation requirements, form factor, and manufacturing cost of the integrated package.

Figure 2A:
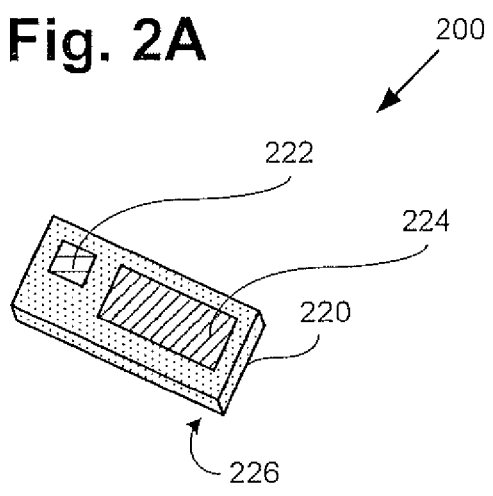
FIG. 2A illustrates a perspective view of a silicon FET.

Discussing FIG. 2A, FIG. 2A illustrates a perspective view of a FET, such as a silicon FET. Diagram 200 of FIG. 2A includes silicon FET 220, which may correspond to silicon FET 120 from FIG. 1. The upper surface of silicon FET 220 includes gate electrode 222 and source electrode 224. The bottom surface of silicon FET 220, hidden from view in FIG. 2A, includes drain electrode 226.

Figure 2B:
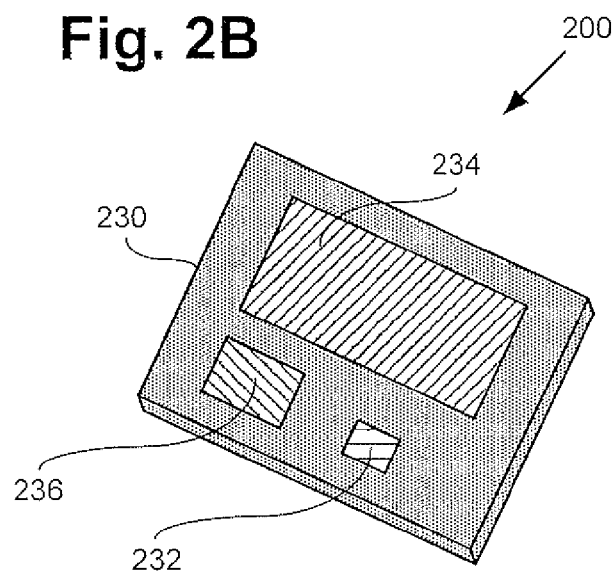
FIG. 2B illustrates a perspective view of a III-nitride transistor.

Turning to FIG. 2B, FIG. 2B illustrates a perspective view of a III-nitride transistor. Diagram 200 of FIG. 2B includes III-nitride transistor 230, which may correspond to III-nitride transistor 130 from FIG. 1. The upper surface of III-nitride transistor 230 includes gate electrode 232, source electrode 234, and drain electrode 236.

Figure 2C:
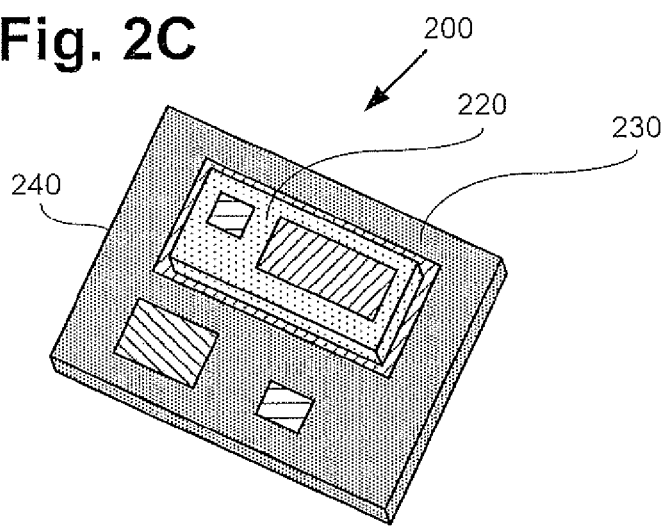
FIG. 2C illustrates a perspective view of a stacked device according to an embodiment of the invention.

Moving to FIG. 2C, FIG. 2C illustrates a perspective view of a stacked device according to an embodiment of the invention. In diagram 200 of FIG. 2C, stacked device 240 is formed by stacking silicon FET 220 from FIG. 2A directly on top of source electrode 234 of III-nitride transistor 230 from FIG. 2B. Thus, the bottom-side drain electrode 226 of silicon PET 220 is electrically coupled to the upper-side source electrode 234 of III-nitride transistor 230. The stacking of silicon FET 220 on top of III-nitride transistor 230 may be effected using, for example, solder, conductive adhesive, conductive tape, or other attachment methods, thereby forming a direct mechanical contact between silicon FET 220 and III-nitride transistor 230. This direct attachment of silicon FET 220 to III-nitride transistor 230 advantageously reduces parasitic inductance and resistance, improves thermal dissipation, reduces form factor and manufacturing cost compared to conventional packaging methods such as co-packing.

Figure 3A:
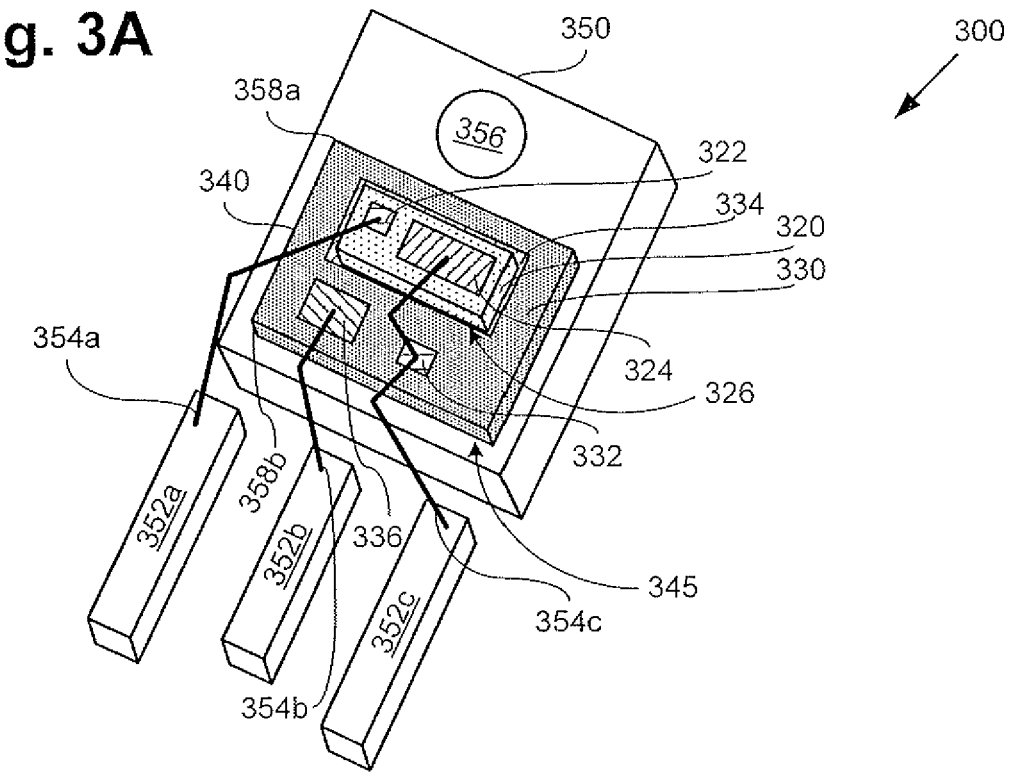
FIG. 3A illustrates a perspective view of a stacked-die package according to an embodiment of the invention.

Turning to FIG. 3A, FIG. 3A illustrates a perspective view of a stacked and leaded package according to an embodiment of the invention. Stacked device 340 may correspond to stacked device 240 from FIG. 2C. Thus, the source electrode 334 of III-nitride device 330 may be electrically and mechanically coupled to the drain electrode 326 of silicon FET 320. As shown in diagram 300 of FIG. 3A, a bottom surface 345 of stacked device 340 is attached to support surface 350, for example by solder, conductive adhesive, conductive tape, nanotechnology materials, or by other methods of attachment. Support surface 350 may comprise, for example, a copper or metal leadframe or header, a substrate comprising direct bonded copper (DBC), an insulated metal substrate (IMS), alumina, aluminum nitride (AlN) or silicon nitride (SiN). A mounting hole 356 may be optionally supplied as shown. Additionally, while the package shown in diagram 300 of FIG. 3A only includes a single stacked device 340, alternative embodiments may also comprise multi-chip modules (MCMs) in a single inline package (SIP) or dual inline package (DIP).

The package of diagram 300 in FIG. 3A is a three terminal package. A first terminal may be coupled to lead 352a and correspond to terminal 112a of FIG. 1. Lead 352a is connected using connector 354a to gate electrode 322 of silicon FET 320, which may correspond to silicon FET 220 of FIG. 2C. A second terminal may be coupled to lead 352b and correspond to terminal 112b of FIG. 1. Lead 352b is connected using connector 354b to drain electrode 336 of III-nitride transistor 330, which may correspond to III-nitride transistor 230 of FIG. 2C. A third terminal may be coupled to lead 352c and correspond to terminal 112c of FIG. 1. Lead 352c is connected using connector 354c to gate electrode 332 of III-nitride transistor 330 and also to source electrode 324 of silicon FET 320. Connectors 354a, 354b, and 354c may comprise, for example, conventional single wirebonds or multiple parallel wirebonds, ribbons, conductive metallic clips, or other connectors comprising conductive materials such as aluminum (Al), gold (Au), copper (Cu), and other metals or composite materials.

While the package in diagram 300 of FIG. 3A comprises a leaded package, such as a TO-220 package, in alternative embodiments leadless packages may be utilized such as a quad flat no-lead (QFN) package or any other custom leadless surface mount device (SMD), for example a laminate or leadframe based package. Additionally, the components of the package in diagram 300 of FIG. 3A may be flexibly oriented and positioned for the convenience of the designer and/or the optimization of the package. For example, III-nitride transistor 330 may be oriented such that source electrode 334 is in closer proximity to corner 358b rather than to corner 358a as in diagram 300 of FIG. 3A, and silicon FET 320 may be reoriented to switch the positions of gate electrode 322 and source electrode 324. If such layout adjustments are made, then connectors 354a, 354b, and 354c may also be reconfigured accordingly to make the required electrical connections of the package as in diagram 100 of FIG. 1.

Figure 3B:
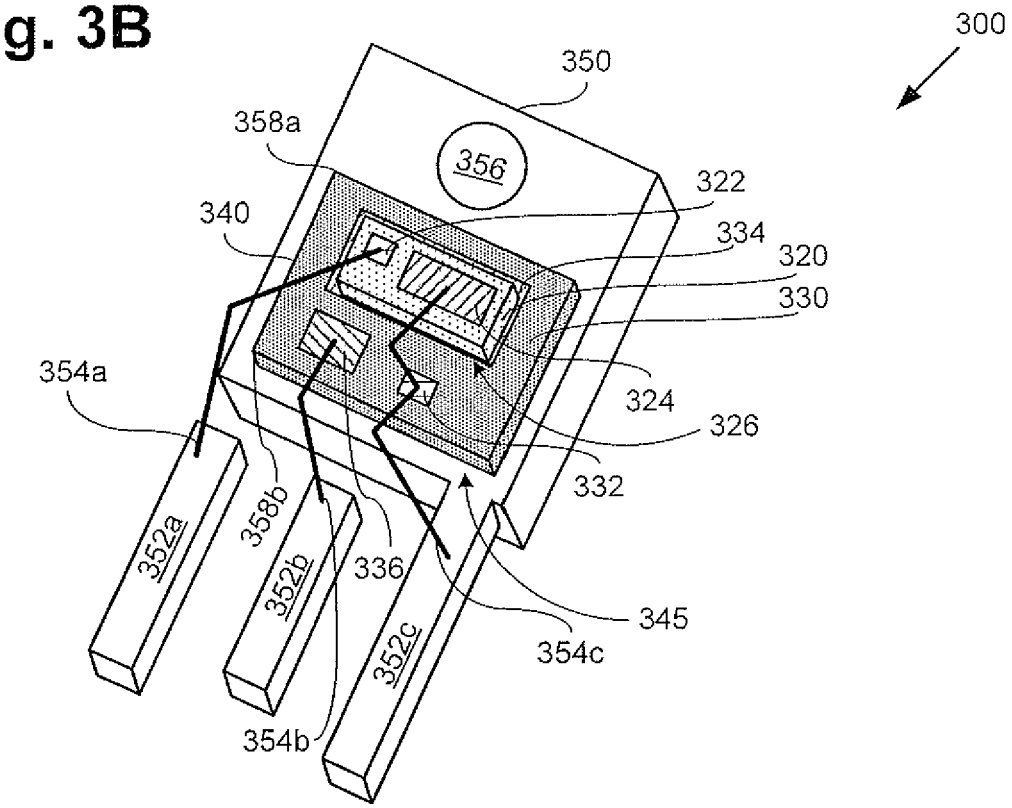
FIG. 3B illustrates a perspective view of a stacked-die package according to another embodiment of the invention.

FIG. 3B illustrates a perspective view of a stacked and leaded package according to another embodiment of the invention. Whereas the package of diagram 300 in FIG. 3A isolates lead 352c from support surface 350, the package of diagram 300 in FIG. 3B couples lead 352c to support surface 350. Thus, the bottom surface 345 of the stacked device 340 is mechanically and electrically coupled to support surface 350 and lead 352c in FIG. 3B, which may be desirable for particular applications.

Thus, a stacked GaN with silicon FET in a package has been described. According to the present invention, by directly stacking a silicon FET on a surface electrode of a III-nitride transistor, a package with reduced parasitic inductance, resistance, improved thermal dissipation, and smaller form factor and lower manufacturing cost may be achieved when compared to conventional packaging methods such as co-packing discrete devices. Moreover, terminal connections and device configurations such as a cascaded switch may be easily implemented using upper-side connectors comprising wirebonds, ribbons or clips.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

The invention is:

1. A package comprising:
   a III-nitride transistor situated on a support surface;
   a field effect transistor (FET) stacked atop said III-nitride transistor, such that a drain of said FET resides on and is electrically coupled to a source of said III-nitride transistor;
   a first lead electrically coupled to a gate of said FET;
   a second lead electrically coupled to a drain on an upper surface of said III-nitride transistor;
   a third lead electrically coupled to a source of said FET, wherein said third lead is further mechanically coupled to said support surface.

2. The package of claim 1, wherein a gate of said III-nitride transistor is coupled to said source of said FET, thereby forming a cascoded switch comprising said III-nitride transistor and said FET.

3. The package of claim 2, wherein said gate of said III-nitride transistor is coupled to said source of said FET by a ribbon.

4. The package of claim 2, wherein said gate of said III-nitride transistor is coupled to said source of said FET by a clip.

5. The package of claim 2, wherein said gate of said III-nitride transistor is coupled to said source of said FET by a wirebond.

6. The package of claim 1, wherein said FET is a silicon FET.

7. The package of claim 1, wherein said III-nitride transistor is selected from the group consisting of a GaN FET and a GaN HEMT.

8. The package of claim 1, wherein said III-nitride transistor comprises a depletion-mode GaN.

* * * * *